(12) United States Patent
Ukaji

(10) Patent No.: US 7,955,938 B2
(45) Date of Patent: Jun. 7, 2011

(54) WIRING TECHNIQUE

(75) Inventor: Takao Ukaji, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 718 days.

(21) Appl. No.: 11/865,887

(22) Filed: Oct. 2, 2007

(65) Prior Publication Data

US 2008/0030699 A1    Feb. 7, 2008

Related U.S. Application Data

(62) Division of application No. 10/950,409, filed on Sep. 28, 2004, now Pat. No. 7,294,906.

(30) Foreign Application Priority Data

Sep. 29, 2003  (JP) ................................. 2003-337253

(51) Int. Cl.
*H01L 21/331* (2006.01)
*H01L 21/8222* (2006.01)

(52) U.S. Cl. ........ 438/311; 438/680; 438/510; 438/535; 257/E21.006; 257/E21.17; 257/E21.077; 257/E21.509; 257/E21.517; 257/E21.475

(58) Field of Classification Search ............... 257/749, 257/662, 666, 673, 678, 712, 717, 720, 763, 257/764, E21.006, 17, 475, 509, 517, 311, 257/510, 535, 680, E21.17, E21.475, E21.509, E21.517; 438/311, 510, 535, 680
See application file for complete search history.

(56) References Cited

U.S. PATENT DOCUMENTS

| | | | |
|---|---|---|---|
| 5,773,953 A | 6/1998 | Ukaji et al. | 318/687 |
| 6,002,987 A | 12/1999 | Kamiya et al. | 702/56 |
| 6,285,457 B2 | 9/2001 | Ukaji | 356/500 |
| 6,310,934 B1 | 10/2001 | Hara et al. | 378/34 |
| 6,552,773 B2 | 4/2003 | Emoto | 355/53 |
| 6,633,045 B1 | 10/2003 | Sugihara et al. | 250/492.1 |
| 6,810,298 B2 | 10/2004 | Emoto | 700/121 |
| 7,294,906 B2 * | 11/2007 | Ukaji | 257/617 |
| 2002/0000029 A1 * | 1/2002 | Emoto | 29/25.01 |
| 2002/0132409 A1 | 9/2002 | Akutsu et al. | 438/200 |
| 2004/0239910 A1 | 12/2004 | Ukaji | 355/72 |

FOREIGN PATENT DOCUMENTS

JP    6-267486    9/1994
JP    2001-93821  4/2001

* cited by examiner

*Primary Examiner* — David Nhu
(74) *Attorney, Agent, or Firm* — Fitzpatrick, Cella, Harper & Scinto

(57) ABSTRACT

An apparatus for supplying electrical power to a movable member. The apparatus includes a fixed member, the movable member moving relative to the fixed member, a flexible wiring member having an end connected to the movable member and another end connected to the fixed member, configured to transmit the electrical power from the fixed member to the movable member, and a cooling member configured to cool the fixed member.

17 Claims, 4 Drawing Sheets

WIRING TECHNIQUE

This application is a divisional of U.S. patent application Ser. No. 10/950,409, filed Sep. 28, 2004, now U.S. Pat. No. 7,294,906. This application also claims priority from Japanese Patent Application No. 2003-337253, filed Sep. 29, 2003, which is hereby incorporated in its entirety.

FIELD OF THE INVENTION AND RELATED ART

This invention relates to a wiring technique for a movable object. More particularly, the invention is suitably applicable to wiring for a movable object, such as a stage, for example, used in a vacuum environment or a movable object in a semiconductor manufacturing apparatus, for example, using EUV (extreme ultraviolet) light, X-rays, or an electron beam (EB), for example.

In semiconductor exposure apparatuses, the tendency toward fineness and largeness in scale of integration, as well, is accelerated day by day, and so, the fineness and precision of patterning to be produced upon a photoresist film is being advanced more and more.

Particularly, in a case wherein an extraordinarily fine and a high-precision pattern is required, such as a VLSI, for example, required patterning is difficult to obtain with conventional photoresist-film exposure methods based on irradiation of light, this being due to restriction by the wavelength of light, for example. Such a difficulty may be overcome by a method using EUV (extreme ultraviolet) light having a much shorter wavelength than conventional light.

Since the EUV light is largely attenuated in an atmosphere, and also, it causes an optical reaction to produce blurring of a surface of a projection optical system, the exposure must be done in an ultra-high vacuum ambience.

An X-Y stage system used in such an EUV exposure light source has a movable structure being controlled with respect to two axial directions, because an image of an original formed by EUV light should be sequentially projected onto a substrate to perform the patterning.

The required resolution of an image to be attained in an EUV exposure apparatus is higher than that required in a conventional exposure apparatus used in an atmosphere, and so, the X-Y stage thereof has an increased precision and an enlarged size. This means that the electric power to be supplied to the X-Y stage movable portion be not less than that of a conventional apparatus used in the atmosphere.

Generally, the wiring for such a movable structure uses wire materials, such as a flexible cable or a robot cable.

Wiring techniques in such a vacuum ambience are disclosed in Japanese Laid-Open Patent Application, Publication No. 06-267486, and Japanese Laid-Open Patent Application, Publication No. 2001-093821.

When such a cable is used in a vacuum, a material being lowest in production of outgas, such as Teflon®, for example, must be used as an insulative material, otherwise, the vacuum level required in an EUV exposure apparatus, for example, cannot be maintained.

Practically, however, with such a cable as described above, not a small amount of outgassing would be produced from the insulative material, causing blur. Further, in the case of stranded wires, such as a robot cable, since the surface area is large, it takes a very long time until moisture molecules, for example, attracted to the conductor surface, are emitted. It is even possible that a few days are necessary until an ultra-high vacuum is reached from the atmospheric pressure. For the maintenance of an exposure apparatus, therefore, the duration of operation stoppage becomes very long, and it causes a reduction in productivity.

When a single-wire (one-wire) is used in place of the strand wire, the surface area itself can be made smaller. However, if it is used to a movable portion, since the flexibility of the single-wire is low, there is a large risk of wire breakage. Practically, therefore, it cannot be used.

On the other hand, as a wire material having a high flexibility, there is a flat cable. The flat cable comprises a thin copper foil adhered to a film of polyimide, for example. However, also in the flat cable, outgas is produced from the film material or an adhesive agent, causing blur. Therefore, the frequency of cleaning of the surfaces of the projection optical system has to be increased, and it leads to an increase of the maintenance cost and a decrease of productivity.

As regards the heat generation from the wires in an ultra-high pressure vacuum, there is no thermal conduction as in the atmosphere and heat can leak only by radiation. Therefore, when the wire is covered by an insulative material, heat cannot leak, and the temperature rises. A cooling medium may be introduced to the moving portion, but, in such a case, there is a possibility that leakage of the coolant causes degradation of the vacuum level.

SUMMARY OF THE INVENTION

It is accordingly an object of the present invention to provide a wiring technique suitably applicable to a movable object in a vacuum ambience.

In accordance with an aspect of the present invention, there is provided a wiring structure for a movable object, comprising an electrically conductive flexible plate-like member having an end connected to the movable object, a holding member which holds the other end of the flexible plate-like member, and a cooling unit which cools the holding member.

In accordance with another aspect of the present invention, there is provided an exposure apparatus for exposing a substrate to a pattern in a vacuum ambience, the apparatus comprising a vacuum chamber, a movable unit disposed inside the vacuum chamber, an electrically conductive flexible plate-like member having an end connected to the movable unit, a holding member which holds the other end of the flexible plate-like member, and a cooling unit which cools the holding member.

In accordance with a further aspect of the present invention, there is provided a device manufacturing method, comprising the steps of exposing a substrate to a pattern in a vacuum ambience by use of an exposure apparatus, and developing the exposed substrate, wherein the exposure apparatus includes (i) a vacuum chamber, (ii) a movable member unit disposed inside the vacuum chamber, (iii) an electrically conductive flexible plate-like member having an end connected to the movable unit, (iv) a holding member which holds the other end of the flexible plate-like member, and (v) a cooling unit which cools the holding member.

These and other objects, features and advantages of the present invention will become more apparent upon a consideration of the following description of the preferred embodiments of the present invention taken in conjunction with the accompanying drawings.

Preferred embodiments of the present invention will now be described with reference to the attached drawings.

Figure 1:
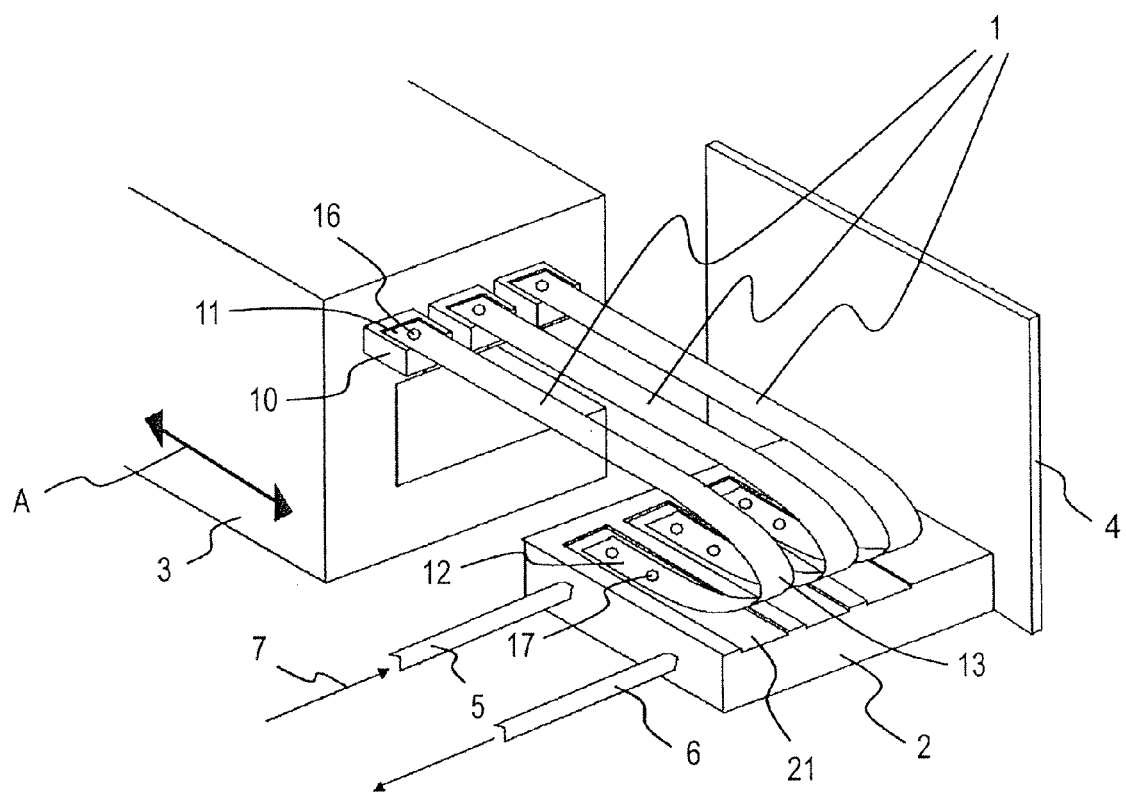
FIG. 1 is a perspective view showing the structure of a wiring arrangement according to an embodiment of the present invention.

FIG. 1 is a perspective view of a basic structure for wiring inside a vacuum stage of an EUV exposure apparatus, according to an embodiment of the present invention.

As shown in FIG. 1, the wiring structure of this embodiment comprises a plurality of thin plate-like members 1 (wire members), and a fixing member 2 to which an end of each thin plate-like member is connected and engaged. The other end of each thin plate-like member 1 is connected to a movable stage 3. There is a heat insulating plate 4, which is standing at one side of the thin plate-like members 1 and the fixing member 2.

The thin-plate like members 1 are provided by ribbon-like or stripe-like elongated members having a uniform thickness and a uniform width and being made of a material having good heat conductivity, good electrical conductivity and good flexibility or flexure, the members being disposed equidistantly at a predetermined spacing (pitch). Each of the thin-plate like members 1 is supported inside the vacuum system by means of a connecting member 10, which projects from the side face of the movable stage 3. Each plate-like member 1 comprises a non-curved end portion 11, a non-curved end portion 12 supported by the fixing member 2, and an approximately U-shaped curved portion 13 between these end portions. The non-curved end portion 11 has one hole through which a bolt 1 or rivet is inserted to fix the end portion 11 to the connecting member 10. The non-curved end portion 12 has plural holes formed intermittently along the lengthwise direction of the thin-plate like member 1, through which bolts 17 or rivets are inserted to fix the end portion 12 to the fixing member 2. As the stage 3 moves in a main movement direction denoted by an arrow A, the curved portion 13 of each thin plate-like member 1 displaces. Each thin plate-like member 1 is made of a metal plate of phosphor bronze, for example, and it is connected to a power supply line, not shown in the drawing.

The fixing member 2 has a flowpassage for a coolant 7 formed therein, and one side face thereof is connected to a coolant supply line 5 and a coolant collection line 6. Thus, the fixing member 2 is formed as a cooling object, which is being cooled. Also, the fixing member 2 has a plurality of straight grooves 21 each extending parallel to the arrow A of the main movement direction. These straight grooves 21 are formed successively in accordance with the width and spacing of the thin-plate like members 1. At the flat bottom of each straight groove, there are two screw holes which receive the bolts 17.

The fixing member 2 is made of a material having a relatively high heat conductivity, such as alumina ceramics, for example. On the surface of the fixing member 2, the thin plate-like members 1 can be closely contacted and fixed. Each thin plate-like member 1 is fixed to the fixing member at plural locations (two locations in this example) to assuredly prevent any change in the distance between the thin plate-like members 1 even when the stage 3 is moved.

The stage 3 has a plurality of connecting members 10 fixedly mounted on one side surface of the stage 3, facing to the fixing member 2, and these connecting members are disposed at the same level and project from the stage 3. The stage 3 is movable in the main movement direction shown by an arrow A, and in a sub-movement direction perpendicular to the main movement direction. The movement amount range in the sub-movement direction is larger than the width of each thin plate-like member 1 and the spacing between adjacent thin plate-like members 1, and, yet, it is smaller than the movement amount range in the main movement direction.

The heat insulating plate 4 is disposed upright so as to reduce the influence of heat radiation to any parts (not shown) having a high sensitivity to temperature. More specifically, the heat insulating plate 4 is disposed so as to cover one side of each thin plate-like member 1 against the temperature-sensitive parts, with the lower portion of the temperature insulating plate being closely contacted to one side of the fixing member 2, remote from the side where the coolant supply line 5 and the coolant collection line 6 are connected.

The connecting members 10 are fixedly mounted to the stage 3 at the same level positions in registration with the spacings of the straight grooves 21 of the fixing member 2. Each connecting member 10 has a straight groove having a width and a depth corresponding to the width and thickness of each thin plate-like member 1. At one location inside the straight groove of the connecting member, a screw bore for receiving a bolt 16 is formed. For connection, each non-curved end portion 11 of the thin plate-like members 1 is inserted into the straight groove of a corresponding connecting member 10, and it is fixedly connected by a single bolt 16.

In FIG. 1, electrical power is supplied to the stage 3 through a power line, not shown in the drawing. Here, the electrical power supplied to the stage 3 refers to a driving electrical current of a motor for moving the stage 3. If any other loads, such as a beater, for example, are mounted on the stage 3, electrical power for such loads may be applied thereto.

The power is supplied to the stage via the fixing member 2 and the thin plate-like members 1. Although the thin plate-like member is made of a material having good electrical conductivity, since it must be flexible, it is difficult to make it thick.

Thus, there is electrical resistance that cannot be disregarded, and heat is generated by transmission of the power. If the electrical resistance is R and the electrical current is I, as is well known in the art, Joule heat W to be produced can be represented by equation (1) below:

$$W = R \times I \times I. \quad (1)$$

Since no air is present in a vacuum, there is no thermal conduction to the air on the basis of which the current rating for electrical wires in the atmosphere is determined. If thermal conduction to the fixing member 2 is not taken into account, the produced Joule heat W should rely upon the heat radiation. Thus, the temperature of the thin plate-like member 1 rises until the heat radiation from the thin plate-like members 1 and the Joule heat balance with each other. If the heat radiation coefficient of the thin plate-like member is Ke, the temperature rise $\Delta Te$ of the thin plate-like member can be expressed by equation (2) below:

$$W = Ke \cdot \Delta Te$$

$$\therefore \Delta Te = W/Ke. \quad (2)$$

It is possible that, depending on the current applied to the stage, the temperature of the thin plate-like member 1 rises excessively and, after a fusing point of the thin plate-like member 1 is reached, the plate is fused. Also, the produced Joule heat may cause a temperature rise of adjacent parts.

On the other hand, inside the fixing member 2, there is a flow of coolant 7 being adjusted at a predetermined temperature and supplied from the coolant supply line 5, and heat exchange proportional to the temperature difference between the fixing member 2 and the coolant 7 is carried out. Consequently, heat flows to the coolant collection line 6.

The thin plate-like members 1 and the fixing member 2 are in intimate contact with each other, and by heat conduction, the produced Joule heat W raises the temperature of the fixing member 2.

The temperature rise $\Delta Tc$ of the thin plate-like member 1 where heat conduction is taken into account is, if the thermal resistance from the thin plate-like member 1 to the coolant 7 is Rc and the heat radiation coefficient of the thin plate-like member 1 is Ke, given by equation (3) below:

$$\Delta Tc=(W-Ke\cdot\Delta Tc)/Rc$$

$$(1+Ke/Rc)\Delta Tc=W/Rc$$

$$\therefore \Delta Tc=W/(Rc+Ke). \quad (3)$$

Such a temperature rise $\Delta Tc$ is lower than the temperature rise $\Delta Te$ where the heat is released only be radiation. Even in this case, however, there still remains thermal transfer of $Ke\cdot\Delta Tc$ due to heat radiation. While such heat may be transmitted to any peripheral part, a portion of such heat can be collected toward the coolant side by means of the heat radiation plate 4, which is provided to reduce the influence to the system having a high sensitivity to temperature.

Figure 2:
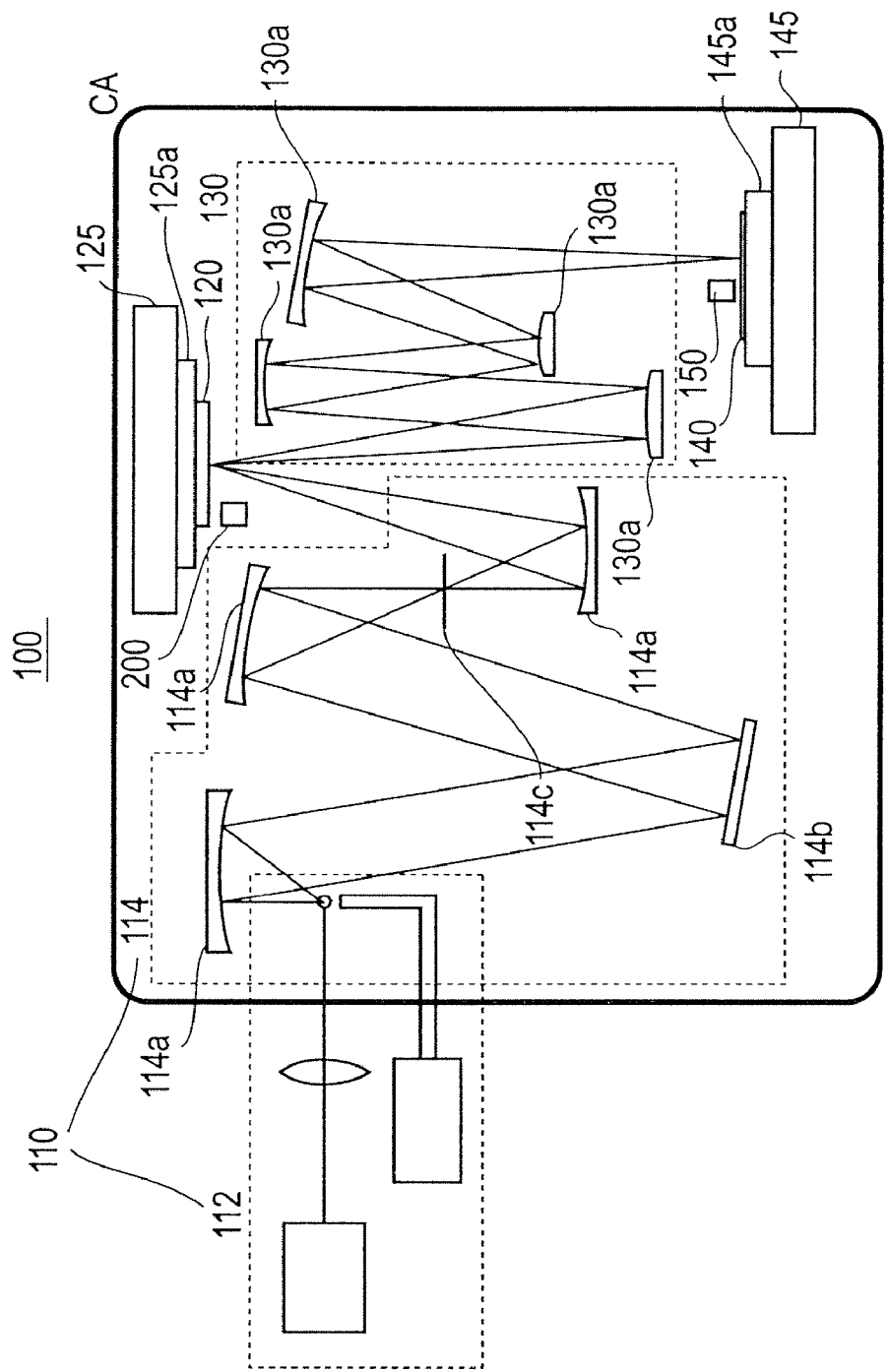
FIG. 2 is a schematic view showing the structure of an exposure apparatus according to an embodiment of the present invention.

FIG. 2 is a schematic and diagrammatic view of the structure of an exposure apparatus 100 according to an aspect of the present invention.

The exposure apparatus 100 is a projection exposure apparatus arranged to use EUV (extreme ultraviolet) light having a wavelength of 13.4 nm, for example, as illumination light for exposure, to transfer a circuit pattern formed on a reticle 120 onto a substrate (object to be exposed) 140 in accordance with a step-and-scan method or a step-and-repeat method. Such an exposure apparatus is particularly suitable for use in a lithographic process of a submicron order or a quatermicron order. This embodiment will hereinafter be explained with reference to an example of a step-and-scan type exposure apparatus, called a scanner. Here, the "step-and-scan method" is an exposure method in which a wafer is continuously scanned (scanningly moved) relative to a reticle to transfer the reticle pattern onto the wafer and, after completion of a single shot exposure, the wafer is moved stepwise to a subsequent exposure region. The "step-and-repeat method" is an exposure method in which, after one exposure region of a wafer is exposed simultaneously, the wafer is moved stepwise to another exposure region for subsequent shot.

Referring to FIG. 2, the exposure apparatus 100 comprises an illumination device 110, a reticle stage 125 for carrying a reticle 120 thereon, a projection optical system 130, a wafer stage 145 for carrying thereon a workpiece (object to be processed) 140, a focus position detecting mechanism 150, and a position detecting device 200.

Also, as shown in FIG. 2, since EUV light has low transmissivity to atmosphere and contaminants are easily produced by reaction with any residual gas component, such as a high molecular organic gas, for example, at least the light path along which the EUV light passes (i.e., the whole optical system) is placed in a vacuum ambience by use of a vacuum chamber CA.

The illumination device 110 is an illumination system for illuminating the reticle 120 with EUV light (e.g., a wavelength of 13.4 nm) of an arcuate shape corresponding to an arcuate-shaped view field of the projection optical system 130. It includes an EUV light source 112 and an illumination optical system 114.

The EUV light source 112 has a laser plasma light source, for example, in which pulse laser light having a large intensity is projected upon a target material placed in a vacuum and a high temperature plasma is produced thereby and in which EUV light having a wavelength of about 13 nm, for example, emitted from the plasma, is used. As regards the target material, a metal film, a gas jet or liquid drops may be used, for example. In order to obtain improved average intensity of the emitted EUV light, the repetition frequency of the pulse laser should be high, and, generally, the laser is operated at a repetition frequency of a few KHz.

The illumination optical system 114 is an optical system for directing EUV light from the EUV light source 112 toward the reticle 120, and it comprises a plurality of multi-layered mirrors or oblique incidence mirrors (condensing mirrors) 114a and an optical integrator 114b, for example. The condensing mirror 114a serves to collect EUV light being approximately isotropically emitted from the laser plasma. The optical integrator 114b has a function for illuminating the reticle 120 uniformly with a predetermined numerical aperture. Also, the illumination optical system 114 includes an aperture (view angle restricting aperture) 114c defined at a position optically conjugate with the reticle 120, for restricting the illumination region on the reticle 120 into an arcuate shape.

The reticle 120 is a reflection type reticle, and it has a circuit pattern (or image) formed thereon, which pattern is going to be transferred. The reticle is supported on and moved by the reticle stage 125. Diffraction light produced from the reticle 120 as illuminated is reflected by the projection optical system 130, and is projected on the workpiece 40 to be exposed. The reticle 120 and the workpiece 140 are disposed in an optically conjugate relationship with each other. The exposure apparatus 100 in this embodiment is a step-and-scan type exposure apparatus, and by scanning the reticle 120 and the workpiece 140, the pattern of the reticle 120 is projected and transferred onto the workpiece 140 in a reduced scale.

The reticle stage 125 supports the reticle 120 through a reticle chuck 125a, and it is connected to a moving mechanism (not shown). The moving mechanism not shown in the drawing comprises a linear motor, for example, and it drives the reticle stage 125 in the X-axis direction, the Y-axis direction, and the Z-axis direction, and rotational directions about these axes as well, thereby to move the reticle 120. Here, the scan direction along the surface of the reticle 120 or the workpiece 140 is taken as the Y axis, a direction perpendicular to it is taken as the X axis, and a direction perpendicular to the surface of the reticle 120 or workpiece 140 is taken as the Z axis.

The projection optical system 130 includes a plurality of mirrors 130a to project a pattern formed on the reticle 120 surface onto the workpiece 140 (image plane) in a reduced scale. As regards the number of mirrors 130a, a smaller number may be preferable to obtain higher EUV light utilization efficiency, but aberration correction becomes more difficult to accomplish. Usually, therefore, four to six mirrors are used. In order to obtain a wide exposure region with a smaller number of mirrors, only a narrow arcuate region (ring field) spaced from the optical axis by a certain distance, may be used, while the reticle 120 and the workpiece 140 are scanned simultaneously. This enables transfer of a wide area.

The numerical aperture (NA) of the projection optical system 130 at the workpiece 140 side thereof is about 0.2 to 0.3. Each mirror 130a can be produced by grinding and polishing a substrate, which is made of a material having a high rigidity and stiffness and a small thermal expansion coefficient, such as low thermal expansion glass or silicon carbide, for example, to obtain a predetermined reflection surface shape (spherical surface shape such as a convexed surface or concaved surface, or an aspherical surface) and, after that, by forming a multilayered film of molybdenum/silicon, for example. When the incidence angle of EUV light upon the mirror 130a is not constant, it is possible that, with a multi-layered film having a regular film period, the reflectivity becomes large in dependence upon the position on the film to cause a shift of the wavelength of the EUV light. In consideration of this, the film should be desirably have a film period distribution to assure that EUV light of the same wavelength is reflected efficiently.

The workpiece 140 is a wafer, in this embodiment. However, it may be a liquid crystal base substrate or any other member to be processed. The workpiece 140 has a photoresist applied thereto.

The wafer stage 145 has a wafer chuck 145a to support the workpiece 140. The wafer stage 145 moves the workpiece 140 in the X-axis direction, the Y-axis direction and the Z-axis direction, and rotational directions about these axes as well, like the reticle stage 125, by use of a linear motor, for example. Also, the position of the reticle stage 125 and the position of the wafer stage 145 are monitored by means of a laser interferometer, for example, and they are driven at a constant speed ratio.

The focus position detecting mechanism 150 measures the focus position upon the workpiece 140 surface, and it controls the position and angle of the wafer stage 145 thereby to continuously hold the workpiece 140 surface at the imaging position of the projection optical system 130 during the exposure process.

The position detecting device 200 includes a TTR alignment optical system, and it has a function for detecting a relative positional relation between the reticle 120 and the workpiece 140.

The wiring structure described hereinbefore can be applied to any moving parts (movable objects), such as reticle stage 125 and wafer stage 145, for example, placed in the vacuum chamber CA.

By use of the wiring structure described above, outgassing from movable wiring cables can be reduced, such that a semiconductor manufacturing apparatus in which the influence of outgas is reduced can be accomplished. Particularly, a wiring structure suitably applicable to a stage inside a vacuum system or a stage inside an ultra-high vacuum is provided.

Further, in accordance with the wiring structure described hereinbefore, the number of parts required can be reduced. Additionally, a wiring structure or a semiconductor manufacturing apparatus in which the influence of heat radiation due to heat generation from wires can be accomplished. Also, a semiconductor manufacturing apparatus, by which the production cost is reduced, is provided.

Next, referring to FIGS. 3 and 4, an embodiment of a device manufacturing method, which uses an exposure apparatus described above, will be explained.

Figure 3:
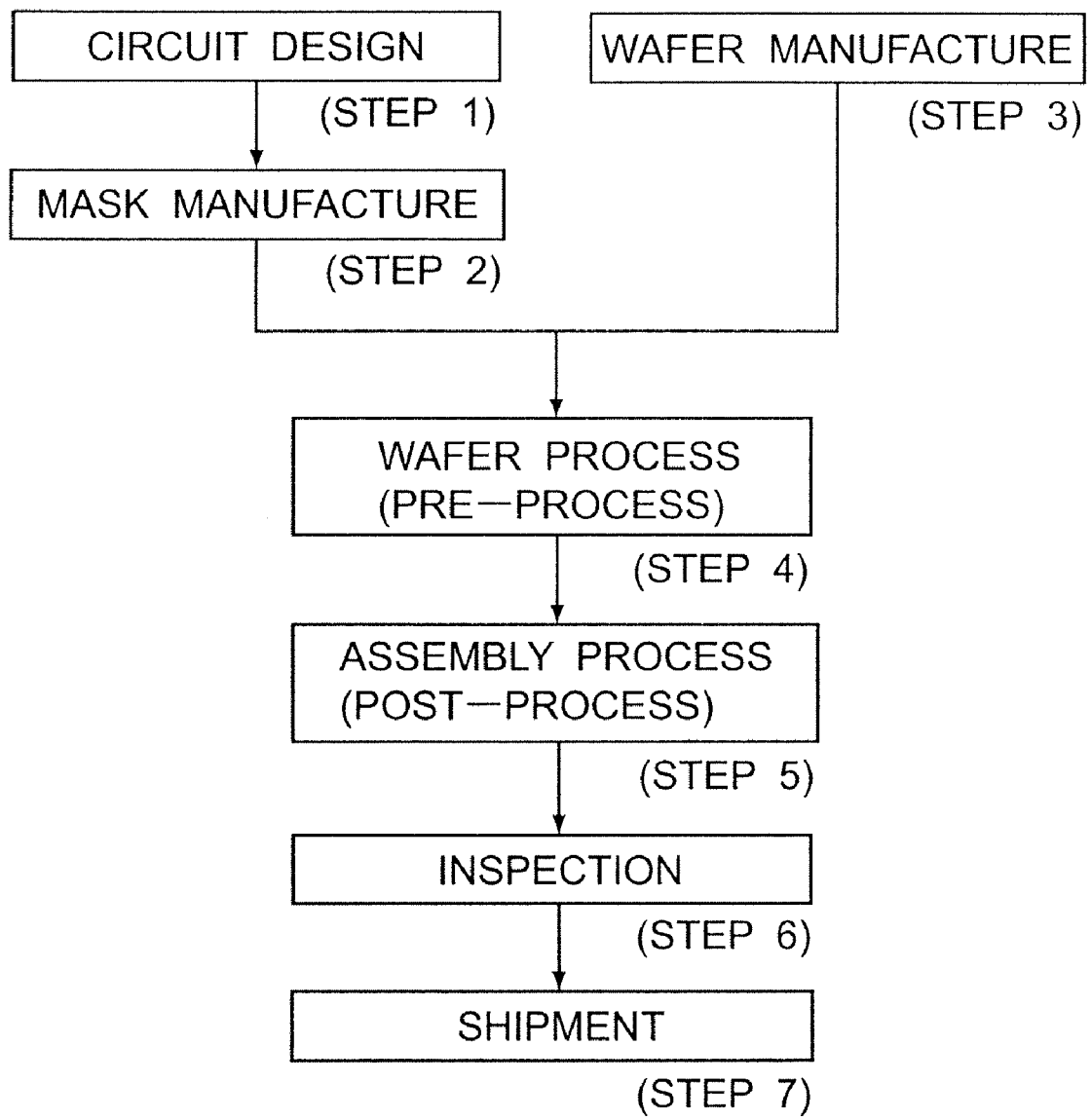
FIG. 3 is a flow chart for explaining the manufacturing procedure of microdevices, such as semiconductor chips (e.g., ICs or LSIs), LCDs or CCDs, for example.

FIG. 3 is a flow chart for explaining the procedure for manufacturing various microdevices, such as semiconductor chips (e.g., ICs or LSIs), liquid crystal panels, or CCDs, for example. Step 1 is a design process for designing a circuit of a semiconductor device. Step 2 is a process for making a mask (reticle) on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembly step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

Figure 4:
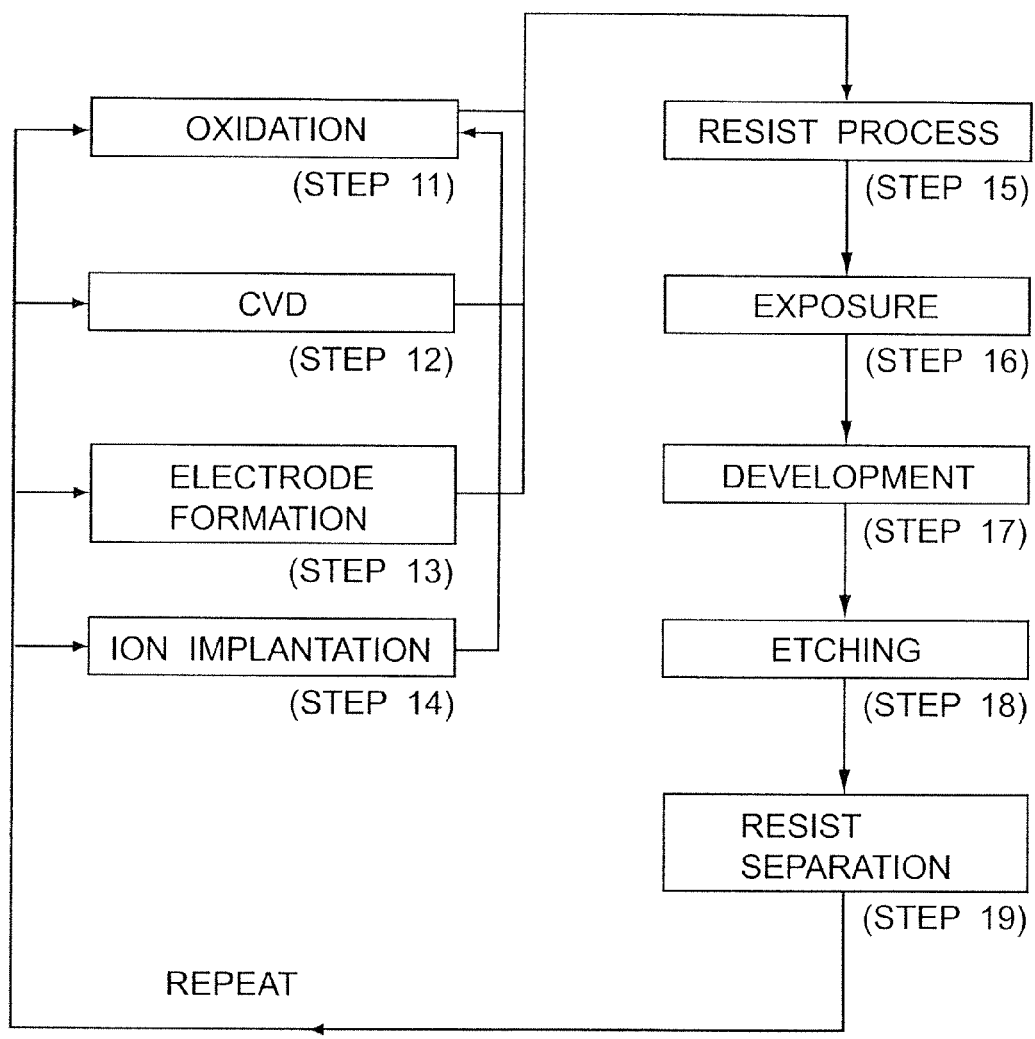
FIG. 4 is a flow chart for explaining details of a wafer process at step 4 in FIG. 3.

FIG. 4 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In accordance with the device manufacturing method of this embodiment, since the exposure apparatus 100 is equipped with a wiring structure effective to reduce the influence of outgassing and heat irradiation, a desired exposure process can be accomplished and, therefore, high-quality devices can be produced.

As described, a device manufacturing method that uses such an exposure apparatus, as well as a device as a product thereof, are also included within the scope of the present invention.

Although the present invention has been explained with reference to some preferred embodiments, the description and the drawings, which are part of the disclosure, this should not be construed so that the present invention is limited thereby. Various alternative forms, embodiments and operation techniques will become apparent to those skilled in the art, on the basis of the disclosure of the subject application. For example, although, in the described embodiments, the coolant 7 flows only through the fixing member 2, a coolant may be passed through the stage 3 side as well such that, on the basis of heat conduction from both sides, temperature rise of the thin plate-like members 1, and the like, may be avoided.

Further, while the above-described embodiments are examples in which the fixing member is made of alumina ceramics, it may be made from an electrode such as a cooper block, for example. Furthermore, the number of the thin plate-like members 1 may be either one or more. The fixing member 2 may be made slightly movable relative to the stage 3. The heat insulating plate 4 may be provided at each side of the fixing member 2, or at three sides of it.

Moreover, while the foregoing embodiments have been described with reference to examples in which the invention is applied to an EUV exposure apparatus as a semiconductor manufacturing apparatus, basically, the invention can be applied widely to a vacuum system and any instruments disposed inside a vacuum system. Particularly, the present invention is effective in a case wherein many movable cables are used inside a vacuum system. As an example, the present invention can be widely applied to manufacturing apparatuses and inspection apparatuses, such as a scan type electron microscope.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-337253, filed Sep. 29, 2003, which is hereby incorporated by reference.

What is claimed is:

1. An apparatus for supplying electrical power to a movable member, said apparatus comprising:
   a fixed member, the movable member moving relative to said fixed member in a predetermined direction;
   a metal plate member, curved to be flexible in the predetermined direction, having an end connected to the movable member and another end connected to said fixed member, and configured to transmit the electrical power from said fixed member to the movable member; and
   a cooling member configured to cool said fixed member,
   wherein said fixed member and said metal plate member are in contact with each other such that said metal plate member is cooled by said cooling member via said fixed member.

2. An apparatus according to claim 1, wherein said metal plate member is made of phosphor bronze.

3. An apparatus according to claim 1, wherein said cooling member includes a cooling medium line provided inside said fixed member.

4. An apparatus according to claim 1, further comprising a shielding plate configured to block heat radiation from said fixed member and said metal plate member.

5. An apparatus according to claim 1, wherein said apparatus is configured to be operated in a vacuum ambience.

6. An apparatus according to claim 1, wherein said fixed member is made of alumina ceramics or copper.

7. An apparatus according to claim 1, wherein the electrical power includes at least one of a motor driving current for moving the movable member and electrical power for a heater provided in relation to the movable member.

8. An exposure apparatus comprising:
   a movable member;
   a fixed member, said movable member moving relative to said fixed member in a predetermined direction;
   a metal plate member, curved to be flexible in the predetermined direction, having an end connected to said movable member and another end connected to said fixed member, and configured to transmit electrical power from said fixed member to said movable member; and
   a cooling member configured to cool said fixed member,
   wherein said fixed member and said metal plate member are in contact with each other such that said metal plate member is cooled by said cooling member via said fixed member.

9. An apparatus according to claim 8, wherein said apparatus is configured to expose a substrate to a pattern, and said movable member is configured to hold one of an original and the substrate and to be moved.

10. An apparatus according to claim 9, wherein said apparatus is configured to use one of EUV light, X-rays and an electron beam for exposure of the substrate to the pattern, and the exposure is performed in a vacuum ambience.

11. An apparatus according to claim 8, further comprising a second cooling member configured to cool said movable member,
    wherein said movable member and said metal plate member are in contact with each other such that said metal plate member is cooled by said second cooling member via said movable member.

12. An apparatus according to claim 1, wherein said metal plate member has an approximately U-shaped curved portion.

13. An apparatus according to claim 8, wherein said metal plate member has an approximately U-shaped curved portion.

14. An apparatus according to claim 9, further comprising a second cooling member configured to cool said movable member,
    wherein said movable member and said metal plate member are in contact with each other such that said metal plate member is cooled by said second cooling member via said movable member.

15. A method of manufacturing a device, said method comprising:
    providing a movable member that is configured to hold one of an original and a substrate to be moved;
    providing a fixed member; moving the movable member relative to the fixed member in a predetermined direction;
    providing a metal plate member, curved to be flexible in the predetermined direction, having an end connected to the movable member and another end connected to the fixed member, and configured to transmit electrical power from the fixed member to the movable member;
    providing a cooling member configured to cool the fixed member, wherein the fixed member and the metal plate member are in contact with each other such that the metal plate member is cooled by the cooling member via the fixed member;
    exposing the substrate to a pattern to produce an exposed substrate; developing the exposed substrate to produce a developed substrate; and processing the developed substrate to manufacture the device.

16. A method according to claim 15, wherein the exposing step uses one of EUV light, X-rays and an electron beam to expose the substrate.

17. A method according to claim 15, wherein the exposing of the substrate is performed in a vacuum ambience.

* * * * *